May 25, 1965 H. W. ABBOTT ETAL 3,185,940

COMPLEMENTARY TRANSISTOR NEGATIVE RESISTANCE RELAXATION OSCILLATOR

Filed July 6, 1961 3 Sheets-Sheet 1

INVENTORS:
HAROLD W. ABBOTT,
HEINZ RAILLARD,

BY Marvin A. Goldenberg
THEIR ATTORNEY.

May 25, 1965 H. W. ABBOTT ETAL 3,185,940

COMPLEMENTARY TRANSISTOR NEGATIVE RESISTANCE RELAXATION OSCILLATOR

Filed July 6, 1961 3 Sheets-Sheet 2

INVENTORS:
HAROLD W. ABBOTT,
HEINZ RAILLARD,
BY
THEIR ATTORNEY.

INVENTORS:
HAROLD W. ABBOTT,
HEINZ RAILLARD,
BY Marvin A. Goldenberg
THEIR ATTORNEY.

United States Patent Office 3,185,940
Patented May 25, 1965

3,185,940
COMPLEMENTARY TRANSISTOR NEGATIVE RESISTANCE RELAXATION OSCILLATOR

Harold W. Abbott and Heinz Raillard, Syracuse, N.Y., assignors to General Electric Company, a corporation of New York Filed July 6, 1961, Ser. No. 122,135
3 Claims. (Cl. 331—111)

The invention relates to a novel low duty cycle transistor pulse generator of high efficiency which provides a narrow width pulse across an inductive element, and in particular to a circuit combination employing such pulse generator to inductively couple bursts of energy to a relaxation oscillator of inherently fixed frequency for purposes of frequency control.

The invention has particular application to the synchronous triggering of an isolated low frequency oscillator circuit of inherently fixed frequency and having components of limited size. One such oscillator circuit is described in a copending application for U.S. Letters Patent Serial No. 101,583, entitled "Transistorized Negative Resistance Networks," filed April 7, 1961, by Heinz Raillard, and assigned to the assignee of the present invention, now Patent Number 3,144,620. Where this oscillator circuit is embedded, or in some manner isolated in a confined space so that the parameters of the circuit are not directly adjustable, an external pulse generator circuit of variable frequency may be provided for inductively coupling a synchronizing pulse to vary the frequency of the isolated circuit. If, further, because of space limitations, the embedded circuit has a low inductance coupling coil for receiving the synchronizing pulse, the external pulse generator circuit must generate its pulse across a low inductance element in order to induce a usable voltage pulse in said coupling coil. Since the time constant of an inductive circuit is proportional to the inductance, the externally generated pulse must be of narrow width, and preferably produced with a minimum of power dissipation. Hence, the invention is concerned with providing a circuit for efficiently generating a low duty cycle pulse of narrow width which may be employed as a reliable trigger for the embedded circuit.

Accordingly, it is an object of the invention to provide an oscillator circuit for generating in an efficient manner a narrow width pulse having an extremely low duty cycle.

It is another object of the invention to provide an oscillator circuit for efficiently generating across an inductance a narrow width pulse having an extremely low duty cycle.

It is a further object of the invention to provide an oscillator circuit for efficiently generating a low frequency narrow width pulse which may be inductively coupled to synchronously trigger a circuit the parameters of which are inherently fixed.

It is a further and more detailed object of the invention to provide an electrical device which includes an isolated oscillator circuit of an inherently fixed frequency and an external pulse generator circuit of variable frequency for providing an efficient low duty cycle synchronizing pulse inductively coupled to said oscillator circuit for changing the frequency thereof.

In accordance with one aspect of the invention there is provided a circuit including a pair of complementary NPN and PNP transistors connected to provide a negative terminal of a source of energizing potential. The base electrode of the NPN transistor is joined to the collector electrode of the PNP transistor at a common juncture, and element. One terminal of the storage capacitor is connected to the emitter electrode of the NPN transistor, the other terminal of said storage capacitor coupled to a negative terminal of a source of energizing potential. The base electrode of the NPN transistor is joined to the collector electrode of the PNP transistor at a common juncture, and the collector electrode of the NPN transistor is connected to the base electrode of the PNP transistor. The positive terminal of the energizing potential source is connected through the inductance element and a current limiting resistor to the emitter electrode of said PNP transistor. An intermediate tap on the potential source is connected through a resistor to said common juncture for providing a bias potential at the base electrode of said NPN transistor. A discharge resistor having a resistance high relative to the resistance of said current limiting resistor is coupled in shunt with the storage capacitor. When the capacitor is considered to be initially in a charged condition, the transistors will be cut off and the capacitor will slowly discharge through the shunt resistor at a relatively low current until a peak point is reached at which the base-emitter diode of said NPN transistor is forward biased and the transistors essentially instantaneously conduct in a saturated mode. Since the voltage across the capacitor cannot change instantaneously, the voltage of the potential source momentarily appears entirely across the inductance element. As this voltage decays, a relatively high current builds up which acts to rapidly charge the capacitor through the current limiting resistor. When the capacitor becomes sufficiently charged, the transistors again cut-off and the cycle repeats. In this manner a narrow width current pulse having a low duty cycle is generated through the inductance element.

In accordance with another aspect of the invention the low duty cycle narrow width current pulse is amplified by a high current amplifier to provide a corresponding pulse of appreciably higher current which pulse is inductively coupled to synchronously trigger an embedded relaxation oscillator, the parameters of which are fixed, for increasing the oscillating frequency of said relaxation oscillator.

These and other aspects of the invention will be better understood from the following description in connection with the drawings in which:

FIGURE 3B is a curve illustrating the voltage wavetriggered relaxation oscillator of FIGURE 4.

Figures 1, 2:
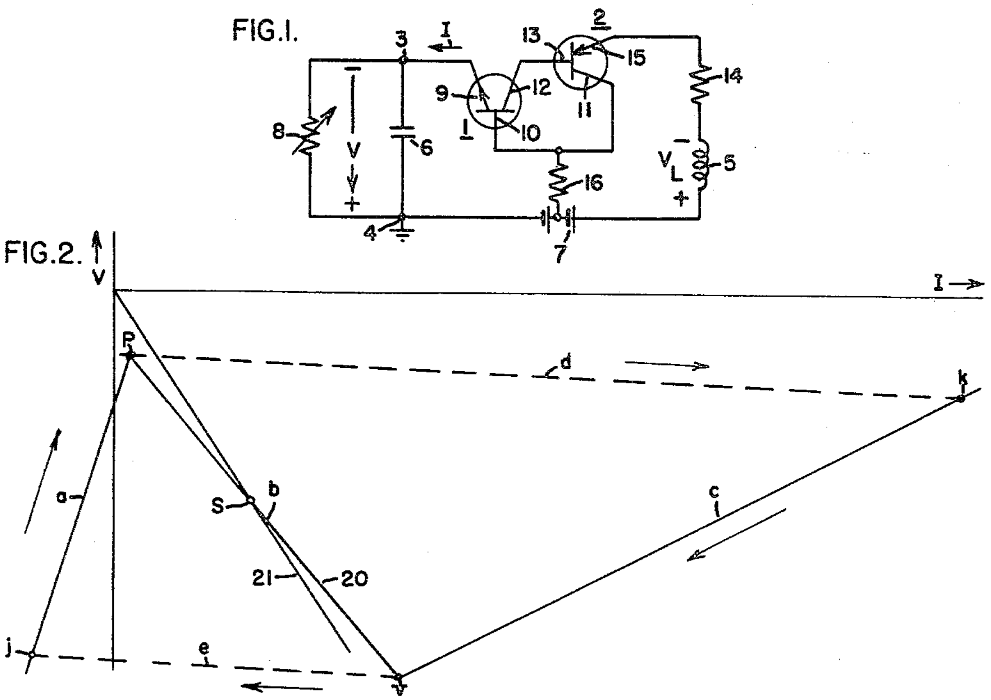
FIGURE 1 is a circuit diagram of a low duty cycle pulse generator in accordance with the invention.
FIGURE 2 is an operating characteristic curve for the circuit of FIGURE 1.

Referring now to FIGURE 1 there is illustrated a relaxation oscillator circuit employing a pair of complementary NPN and PNP transistors 1 and 2 connected between terminals 3 and 4 in a negative resistance configuration to provide an efficient, low duty cycle narrow width pulse across an inductance element 5. Oscillations are provided by a storage capacitor 6 being successively charged through transistors 1 and 2 by a source of energizing potential 7 and discharged through a variable resistor 8, transistors 1 and 2 being nonconducting during the discharge period. Terminal 3 is connected to the emitter electrode 9 of transistor 1. The base electrode 10 of transistor 1 is connected to the collector 11 of transistor 2, and the collector electrode 12 of transistor 1 is connected to the base electrode 13 of transistor 2. The energizing potential source 7, which is conventionally a battery, has its positive terminal coupled through a series connection of the inductor 5 and a resistor 14 to the emitter electrode 15 of transistor 2. A terminal tap of battery 7 is connected through resistor 16 to the juncture of base and collector electrodes 10 and 11. The negative terminal of battery 7 is connected to terminal 4, which is grounded. The storage capacitor 6 is connected between terminals 3 and 4, and the resistor 8 is connected in shunt between terminals 3 and 4.

The operation of the circuit of FIGURE 1 may be best analyzed by considering the static V–I characteristic between terminals 3 and 4, where V is the voltage between terminals 3 and 4 and I is the current at terminal 3, as indicated in FIGURE 1. This characteristic is shown approximated in FIGURE 2 by curve 20 which includes three straight line segments "*a*," "*b*" and "*c*." At segment "*a*," the base-emitter diode of transistor 1 is reversely biased and the transistors 1 and 2 are nonconducting. For this condition the current I at terminal 3 is negative and extremely small. The bias potential of the base electrode 10 is approximately equal to the potential of the tapped terminal of battery 7. As the voltage V becomes more positive so that the voltage at terminal 3 referenced to ground becomes less opsitive than the base electrode 10 to ground voltage, a peak point "*p*" on the V–I static characteristic curve 20 is reached where the transistors 1 and 2 conduct in a regenerative fashion to provide a negative resistance operation, indicated by segment "*b*,' wherein an increase in current I is accompanied by a decrease in voltage V. Negative resistance operation continues until transistors 1 and 2 saturate, which occurs at the valley point "*v*" of the curve 20, beyond which point operation is of the positive resistance type, shown by segment "*c*." A more complete discussion of this form of operation is given in the above-referenced Raillard application.

Taking into account the presence of inductor 5 and capacitor 6, the circuit is provided with nonlinear oscillation, the operating characteristic curve 20 being modified by segments "*d*" and "*e*," shown in dotted outline. A necessary condition for oscillation is that the static load line 21 due to resistor 8 intersect the static V–I characteristic curve 20 at a point "*s*" located on segment "*b*." For this condition the changes in voltage and current, V and I, during oscillation are indicated by the arrows along the path "*a*," "*d*," "*c*" and "*e*."

The capacitor 6 may be said to be initially fully charged so that the V–I coordinates are at point *j*. The capacitor 6 will then discharge through shunt resistor 8, normally a relatively high resistance component, so that the discharge time is slow. A small leakage current will also flow through the transistors. This portion of the operation corresponds to the segment "*a*." At the peak point "*p*" the transistors 1 and 2 assume a saturated state of conduction within an exceedingly short time interval, during which interval the voltage of source 7 is developed across the inductor 5. In order for a discrete pulse to appear across inductor 5, this time interval, corresponding to the pulse rise time, must be a small fraction of the time constant of the circuit determined essentially by the ratio of the inductance L of element 5 to the resistance R of element 14. As the voltage across the inductor 5 decays, current rapidly builds up in the circuit along segment "*d*" until point "*k*" is reached. The total time of travel from point "*p*" to "*k*" is extremely short so that the voltage at point "*k*" is seen to be only slightly less than at "*p*," due to slight charging of the capacitor. The current flows through the resistor 14 and transistors 1 and 2 to charge the capacitor 6, as indicated by the path along segment "*c*," until the valley point "*v*" is reached, at which point the transistors will cut off and the current snaps to point "*j*." Discharge of the capacitor follows and the oscillation cycle repeats. The charge time is normally fast compared to the discharge time, since the charge current is much higher than the discharge current.

Figure 3A:
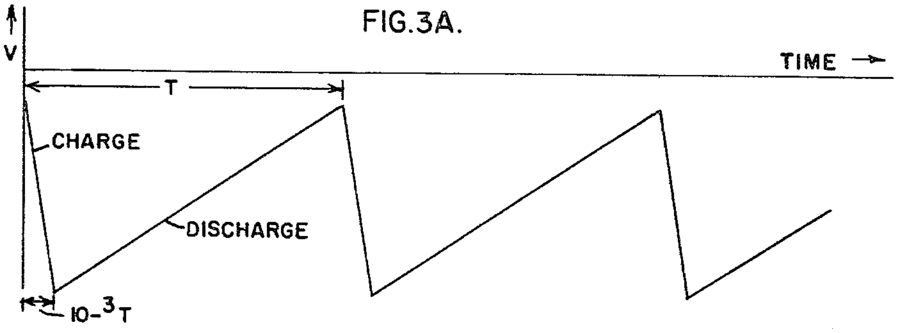
FIGURE 3A is a curve illustrating the voltage waveform across the storage capacitor of the circuit of FIGURE 1.

The oscillations of the circuit produce a sawtooth waveform across capacitor 6, as shown in FIGURE 3A. The negative slope of the sawtooth waveform corresponds to the fast charge time of the capacitor 6 determined by the time constant $\tau_1=RC$ for segment "*c*," where R is the resistance of element 14 and C is the capacitance. The positive slope corresponds to the slow discharge time of the capacitor 6 determined by the time constant $\tau_2=R_1C$ for segment "*a*," where $R_1$ is the resistance of element 8. The magnitude of resistor 8 is selected to be many orders greater than resistor 14 so that the charge time is approximately $1/1000$ of the discharge time, corresponding to a duty cycle of $10^{-3}$. The circuit is highly efficient since energy is applied through a load only during the short charge period. The circuit may be likened to one wherein a storage capacitor is successively charged for a short period through a first circuit including a load and a nearly perfect switch, and discharged through a second circuit including a discharge resistor.

By inserting the inductance element 5, the duty cycle is further reduced. Thus, the voltage across inductor 5 is a narrow width pulse, shown in FIGURE 3B, occurring during the initial portion of the charge time and having a width equal to approximately $1/1000$ of the charge time, providing a $10^{-6}$ duty cycle pulse having the efficiency of a $10^{-3}$ duty cycle pulse.

Figure 4:
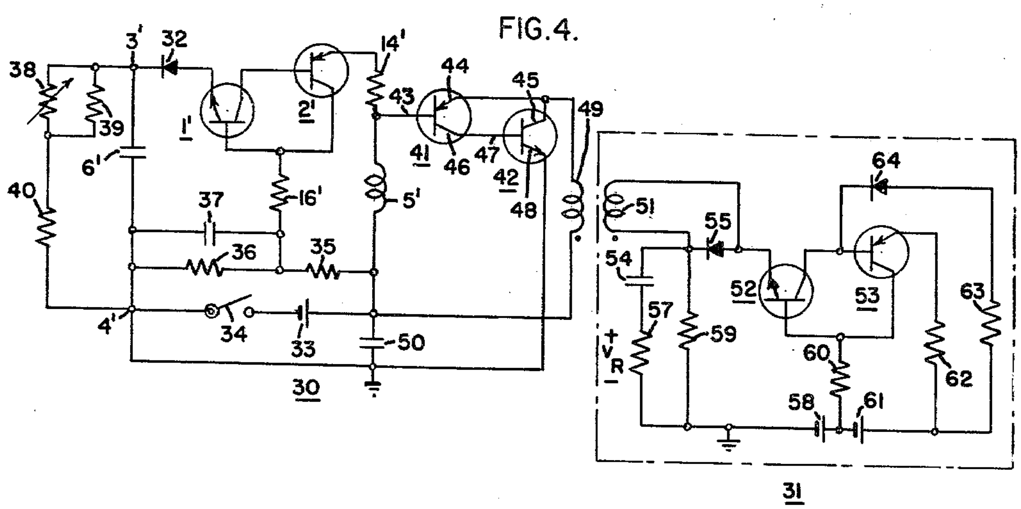
FIGURE 4 is a circuit diagram of a low duty cycle pulse generator, a modified embodiment of the circuit of FIGURE 1, which is inductively coupled to an embedded relaxation oscillator of inherently fixed frequency to synchronously trigger said relaxation oscillator for increasing the frequency thereof.

Referring now to FIGURE 4 there is illustrated a circuit diagram of a low duty cycle pulse generator 30 which inductively couples a burst of energy for synchronously triggering a stabilized low frequency relaxation oscillator 31 having an inherently fixed frequency of oscillation, as a result of being embedded or in some manner isolated, as schematically represented by the dotted outline. The frequency of the low duty cycle pulse generator 30 is adjustable and is made greater than the fixed frequency of the relaxation oscillator 31 for increasing said fixed frequency. The pulse generator 30 is a modified embodiment of the oscillator described with reference to FIGURE 1. The relaxation oscillator 31 is basically similar to a circuit disclosed in the above-referred Raillard application.

Considering the pulse generator 30, the components therein which are similar to the components of the circuit of FIGURE 1 are similarly identified, but with an added prime notation. Terminal 3′ is connected through a protective diode 32 to the emitter electrode of transistor 1′. The diode is poled in the same direction as the base-emitter diode of transistor 1 and prevents breakdown of the base-emitter diode when it is biased in the backward direction. The electrodes of transistors 1′ and 2′ are seen to be connected to each other and to resistors 14′ and 16′ in the same fashion as in FIGURE 1. The circuit is energized by a battery 33, the negative terminal of which is connected through an ON–OFF switch 34 to terminal 4′. The positive terminal of battery 33 is connected as before through inductor 5′ and resistor 14′ to the emitter electrode of transistor 2′. In shunt with the battery 33 and switch 34, between the positive terminal of the battery and terminal 4′, is connected a voltage divider circuit comprising resistors 35 and 36 connected in series. The junction of resistors 35 and 36 is connected through resistor 16′ to the base electrode of transistor 1′ for supplying a bias voltage thereto. A capacitor 37 is connected in shunt with resistor 36 between said junction and terminal 4' for stabilizing the voltage at the junction point when the transistors are conducting. Capacitor 6' is connected between terminals 3' and 4', and in shunt therewith is connected a controllable resistance network comprising the parallel combination of variable resistor 38 and resistor 39 connected in series with resistor 40.

A cascaded output amplifier stage is provided for amplifying the current pulse appearing through inductor 5'. The output amplifier includes PNP transistor 41 and NPN transistor 42, the base electrode 43 of transistor 41, which is at the amplifier input, being connected to the junction of inductor 5' and resistor 14'. The emitter electrode 44 of transistor 41 is connected to the collector electrode 45 of transistor 42, and the collector electrode 46 of transistor 41 is connected to the base electrode 47 of transistor 42. The emitter electrode 48 of transistor 42 is connected to terminal 4', and the juncture of the emitter 44 and collector 45 is connected through an inductor 49 of low inductance relative to inductor 5 to the positive terminal of battery 33, the amplified current pulse appearing through inductor 49. A capacitor 50 is connected in shunt with the battery 33 and switch 34 to maintain the positive terminal of the battery at a perfectly constant voltage.

Figure 5A:
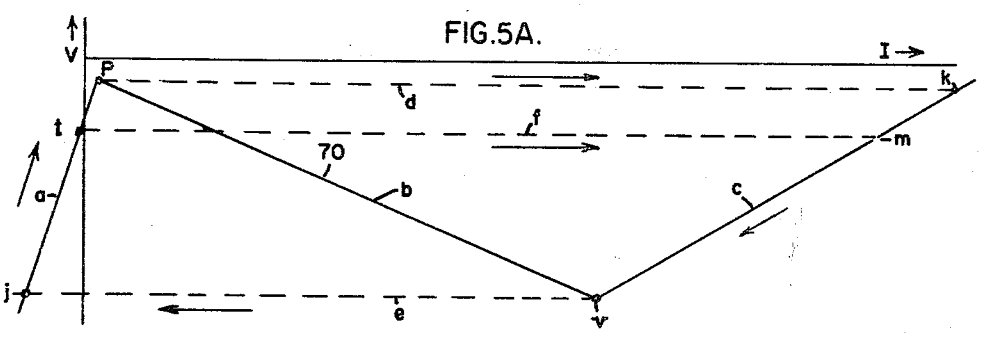
FIGURE 5B is a curve illustrating the voltage waveform across the output resistor of the triggered oscillator circuit of FIGURE 4 at the normal frequency.
FIGURE 5C is a curve illustrating the voltage waveform across the output resistor of the triggered oscillator at the increased frequency.
Figure 5B:
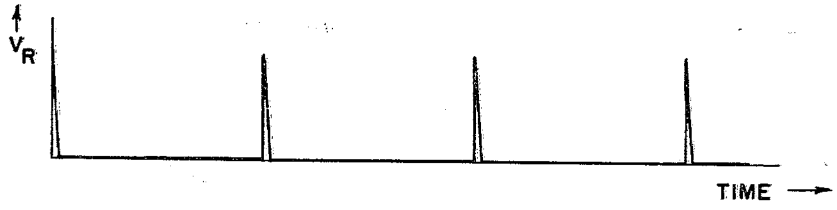

Inductor 49 is coupled to an inductor 51 of the isolated relaxation oscillator circuit 31 for synchronously triggering the oscillator. The transistor arrangement of the oscillator circuit 31, including transistors 52 and 53, is seen to be similar to the circuit of FIGURE 1, and in combination with storage capacitor 54 provides oscillations in a manner similar to that described previously. Inductor 51 is connected between the emitter electrode of transistor 52 and storage capacitor 54. Diode 55, poled in the same direction as the base-emitter diode of transistor 52, is connected in parallel with inductor 51 as a protective element to make the circuit "fail safe" should the leads to inductor 51 open circuit. Resistor 57, across which the output pulse of the oscillator circuit 31 appears during the charge period of capacitor 54, is serially connected between the capacitor 54 and the negative terminal of battery 58. Resistor 59, of a resistance considerably greater than that of resistor 57, is connected in shunt with capacitor 54 and resistor 57 for discharging the capacitor. The positive terminal of battery 58 is connected through a biasing resistor 60 to the junction of the base electrode of transistor 52 and the collector electrode of transistor 53, and to the negative terminal of a battery 61. The positive terminal of battery 61 is connected through a current limiting resistor 62 to the emitter electrode of transistor 53. Batteries 58 and 61 serve to charge capacitor 54 through transistors 52 and 53, as explained with reference to FIGURE 1. A stabilizing circuit including the series connection of a resistor 63 and a diode 64 is connected between the positive terminal of battery 61 and the base electrode of transistor 53, diode 64 being poled in the forward direction with respect to the batteries. As described in the above-referenced Raillard application, this circuit connection extends the valley point of the negative resistance region, thereby providing stabilization of the oscillator circuit. The operating characteristics curve 70 for the oscillator 31 is illustrated in FIGURE 5A wherein for oscillation the V–I coordinates follow a path along the segments "*a*," "*d*," "*c*" and "*e*," shown by the arrows. The output pulses appearing across resistor 57 are shown in FIGURE 5B.

Figure 3B:
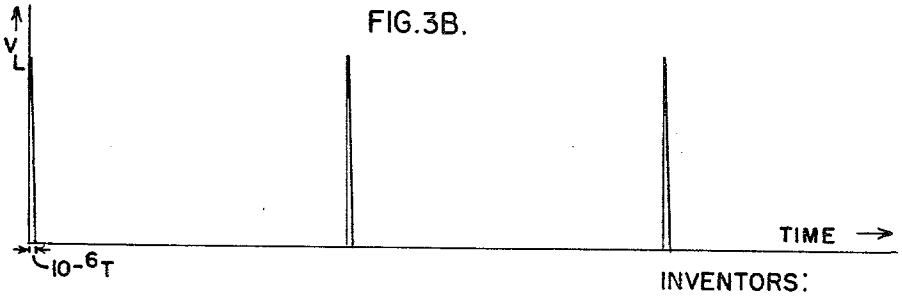
FIGURE 3B is a curve illustrating the voltage waveform across the induction element of the circuit of FIGURE 1.

In the operation of the oscillator circuit 30 of FIGURE 4, with the switch 34 closed, oscillations will occur as described with reference to the circuit of FIGURE 1, and a succession of low duty cycle pulses, as shown in FIGURE 3B, are developed across inductor 5'. The arrangement of the discharge resistors 38, 39 and 40 provide a frequency of operation between predetermined limits ranging from the lowest frequency $f_1$, with resistor 38 of maximum resistance, to the highest frequency $f_2$, with resistor 38 of zero resistance.

The configuration of the transistors 41 and 42 of the output amplifier provides a high current amplification of the current pulse through inductor 5', while providing a negligible loading of the circuit at the juncture of inductor 5' and resistor 14'. Thus, during conduction of transistors 41 and 42, the base emitter voltage drop of transistor 41 is sufficiently small so that the voltage across inductor 5' essentially appears across inductor 49. Since the inductance of inductor 49 is considerably less than inductor 5', and the voltages across the inductors is equal, the current through inductor 49 is greater than through inductor 5' by the inverse ratio of the inductances. As the voltage across inductor 5' decays, the voltage across the inductor 49 follows, the transistors being cutoff at the extinction of the voltage across inductor 5'. Therefore, a pulse of the same width appears through the two inductors, but a much greater current pulse appears through inductor 49. It may be appreciated that the current pulse across inductor 49 is an extremely low duty cycle pulse having considerable energy content. Since the energy added to the pulse through inductor 49 by the amplifier circuit is applied only during the existance of the voltage pulse, the efficiency of the output pulse generated is further improved.

Figure 5C:
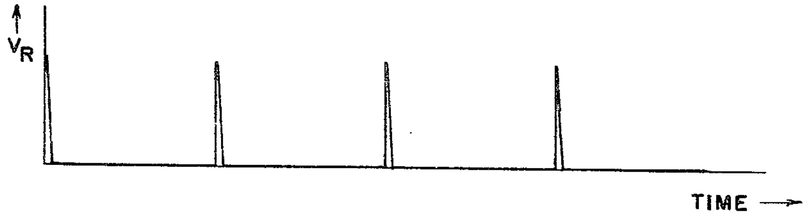

The energy in the pulse through inductor 49 is inductively coupled to inductor 51 which supplies a negative potential pulse between the emitter of transistor 52 and ground for prematurely triggering transistor 52 and 53 into conduction. Considering the operating characteristics curve 70 of the oscillator circuit 31, shown in FIGURE 5A, the trigger pulse is introduced at a point "*t*" on the discharge segment "*a*." This instantaneously raises the voltage V to the peak point "*p*" and the transistors conduct, which terminates the discharge portion of the cycle. Since the voltage across capacitor 54 cannot change instantaneously, the V–I coordinates switch to point "*m*" along path "*f*," and the charge cycle along segment "*c*" between points "*m*" and "*v*" occurs. At point "*v*" the operating parameters V, I switch to point "*j*" and discharge occurs. In this manner the frequency of oscillations of the circuit 31 is synchronized with the control circuit 30, and an output pulse, such as shown in FIGURE 5C, may be made to appear across resistor 57.

In one practical embodiment of the invention as illustrated in FIGURE 4 in which the normal frequency of operation of the oscillator circuit 31 of about one cycle per second may be increased by a factor of two or greater. The following circuit components were employed, which are presented for purposes of illustration and should not be construed as limiting:

| | |
|---|---|
| Transistor 1' | NPN type 2N335. |
| Transistor 2' | PNP type 2N495. |
| Transistor 41 | PNP type 2N495. |
| Transistor 42 | NPN type 2N549. |
| Transistor 52 | NPN type 2N708. |
| Transistor 53 | PNP type 2N865. |
| Resistor 14' | 100 ohms. |
| Resistor 16' | 5.1K ohms. |
| Resistor 35 | 330K ohms. |
| Resistor 36 | 51K ohms. |
| Resistor 38 | 1M ohm variable. |
| Resistor 39, 40 | 500K ohms. |
| Resistor 57 | 300 ohms. |
| Resistor 59 | 100K ohms. |
| Resistor 60 | 82K ohms. |
| Resistor 62 | 2K ohms. |
| Resistor 63 | 51 ohms. |
| Capacitor 6'' | .5 μfarad. |
| Capacitor 37 | 10 μfarads. |
| Capacitor 50 | 40 μfarads. |
| Capacitor 54 | 4 μfarads. |
| Diodes 32, 55 | Type 1N191. |
| Diode 64 | Type 1N461. |

| | |
|---|---|
| Inductor 5′ | 470 μHenries |
| Inductor 49 | 5 μH, 10 turns No. 28 wire. |
| Inductor 51 | .5 mH, 100 turns No. 32 wire. |
| Battery 33 | 22.5 volts. |
| Battery 58 | 1.4 volts. |
| Battery 61 | 4.2 volts. |

Figure 6:
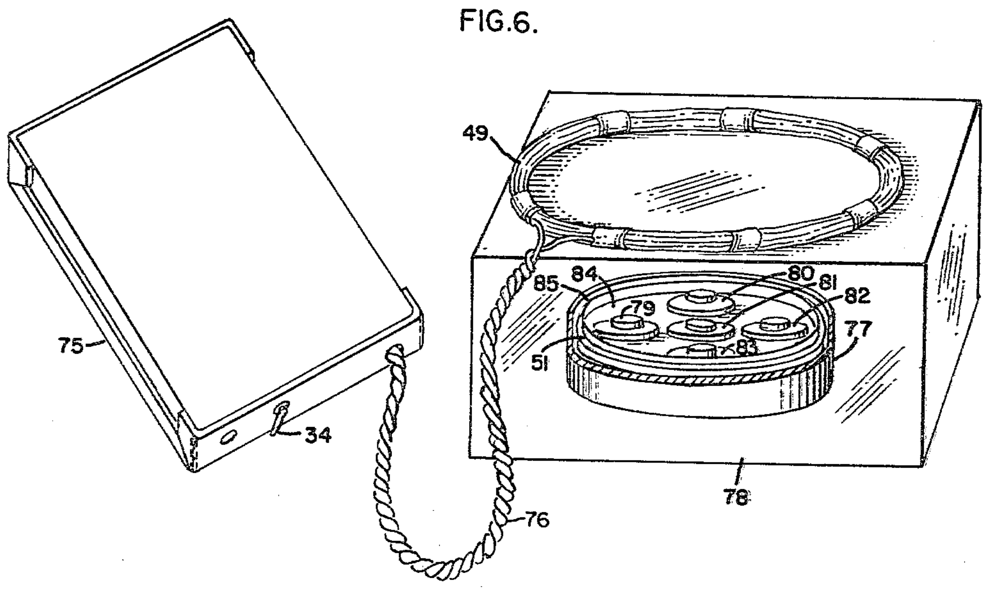
FIGURE 6 is a partially detailed three dimensional schematic diagram of the structure of FIGURE 4.

Referring to FIGURE 6 there is illustrated a three dimensional schematic diagram showing in part the structure of the circuit of FIGURE 4. The pulse generator 30 of FIGURE 4 is enclosed in a casing 75. Coil 49 is connected by lead wires 76 to the enclosed circuitry. The oscillator circuit 31 is enclosed in a cylindrical casing 77, the cover of which has been removed and the side partially broken away. Casing 77 is shown embedded in a material 78. Batteries 79, 80, 81, 82 and 83, which correspond to batteries 58 and 61 of the circuit of FIGURE 4 are mounted between two parallel mounting boards, of which only board 84 is shown. The remaining components of the oscillator circuit are mounted between the two mounting boards and are not visible. Coil 51 is wound about the enclosed components on an insulating cylinder 85 which lines the inside of the casing 77, the coil being connected to the enclosed circuitry. In this manner, the coil 51 is provided with a maximum diameter within a confined space for the most advantageous coupling of the received energy. It is noted that coil 49 is of larger diameter than that of coil 51. In this manner the coil 49 need not be positioned precisely concentric or parallel with respect to coil 51 for satisfactory coupling.

It may be appreciated that numerous modifications may be made to the circuits herein illustrated without exceeding the basic teachings of the invention. Hence, the transistors of the complementary transistor pairs included in the oscillators described may be interchanged, accompanied by the necessary reversal of potential connections. In addition, the complementary transistors may be readily replaced by a single PNPN or NPNP transistor which have been shown to function in an identical manner. An example of such teaching is found in an article by J. J. Ebers entitled, "Four-Terminal P-N-P-N Transistors," in the Proceedings of the IRE, vol. 40, No. 12, November 1952. The first N region of an NPNP transistor may be said to correspond to the current ejecting emitter electrode 9 of FIGURE 1; the first P region corresponds to the control base electrode 10 and to the collector electrode 11; the second N region corresponds to the floating collector and base electrodes 12 and 13; and the second P region corresponds to the current injecting emitter electrode 15.

The appended claims are intended to include all modifications falling within the true scope and spirit of the invention.

What we claim is new and desire to secure by Letters Patent of the United States is:

1. A low duty cycle pulse generator circuit comprising a semiconductor arrangement having at least four alternate regions of opposite conductivity and exhibiting current amplification, having a current ejecting electrode, a control electrode and a current injecting electrode, a first series connection of a first resistance and a means providing a first energizing potential connected in the order recited between said control electrode and said current injecting electrode, said semiconductor arrangement thereby providing a negative resistance characteristic in response to energy applied thereto, a second series connection including a second resistance and a means providing a second energizing potential connected between the current ejecting electrode and a point on said first series connection, a capacitance connected in shunt with a portion of said second series connection, said portion including said second resistance, said circuit thereby operating as an oscillator, during the course of the oscillations said semiconductor arrangement being switched between a conducting and a nonconducting state, a path including said capacitance being thereby formed which joins said current ejecting electrode and said current injecting electrode, an inductance connected in said path having a transient current generated therein upon conduction of said semiconductor arrangement, the rise time of said transient current as determined by the circuit parameters including said inductance being a small fraction of the time of conduction per cycle of said semiconductor arrangement whereby the oscillations of said circuit provide an efficient low duty cycle pulse across said inductance.

2. A low duty cycle pulse generator circuit comprising a pair of complementary transistors each having base, emitter and collector electrodes, the base electrode of a first transistor of said pair connected to the collector electrode of a second transistor of said pair and the collector electrode of said first transistor connected to the base electrode of said second transistor, a first series connection of a first resistance and a means providing a first energizing potential connected in the order recited between the collector and emitter electrodes of said second transistor, said transistors thereby providing a negative resistance characteristic in response to energy applied thereto, a second series connection of a second resistance and a means providing a second energizing potential connected between the emitter electrode of said first transistor and a point on said first series connection, said point being between said first resistance and the emitter electrode of said second transistor, a capacitance connected in shunt with a portion of said second series connection, said portion including said second resistance, said capacitance being successively charged and discharged through said transistors and said second resistance so that said circuit operates as an oscillator, during the course of the oscillations said transistors being switched between a conducting and a nonconducting state, a path including said capacitance being thereby formed which joins the emitter electrode of said first transistor and the emitter electrode of said second transistor, an inductance element connected in said path having a transient current generated therein upon conduction of said transistors, the rise time of said transient current as determined by the circuit parameters including said inductance being a small fraction of the conduction time per cycle of said transistors whereby the oscillations of said circuit provide an efficient low duty cycle pulse across said inductance element.

3. A low duty cycle pulse generator circuit as in claim 2 wherein a current limiting resistance is connected in said path in series with said inductance element, the rise time of said transient current generated in said inductance element being substantially a function of the inducance and said current limiting resistance.

References Cited by the Examiner

UNITED STATES PATENTS

| | | | |
|---|---|---|---|
| 2,784,315 | 3/57 | Moleman et al. | 331—117 X |
| 2,786,138 | 3/57 | Wherry | 331—153 |
| 2,829,257 | 4/58 | Root | 331—111 |
| 2,852,680 | 9/58 | Radcliffe | 331—115 |
| 2,864,062 | 12/58 | Schaffner | 331—115 X |
| 2,901,669 | 8/59 | Coleman | 331—111 |
| 2,904,758 | 9/59 | Miranda et al. | 307—88.5 X |
| 3,045,192 | 7/62 | Jones | 307—88.5 |

ROY LAKE, *Primary Examiner.*

ARTHUR GAUSS, *Examiner.*